United States Patent [19]
Wu

[11] Patent Number: 6,008,081
[45] Date of Patent: Dec. 28, 1999

[54] METHOD OF FORMING ELECTROSTATIC DISCHARGE PROTECTION STRUCTURE OF DYNAMIC RANDOM ACCESS MEMORY

[75] Inventor: Tsung-Chih Wu, Hsinchu Hsien, Taiwan

[73] Assignee: United Microelectronics Corp., Taipei, Taiwan

[21] Appl. No.: 09/126,285

[22] Filed: Jul. 30, 1998

[30] Foreign Application Priority Data

Jun. 6, 1998 [TW] Taiwan ................................. 87108986

[51] Int. Cl.⁶ ............................................... H01L 21/8238
[52] U.S. Cl. .......................... 438/210; 438/279; 438/200; 438/253; 438/396
[58] Field of Search ..................... 438/260, 280, 438/239, 241, 253, 256, 275, 279, 283, 303, 329, 330, 381, 382, 396, 597, 618, 620, 637

[56] References Cited

U.S. PATENT DOCUMENTS

| | | | |
|---|---|---|---|
| 5,455,444 | 10/1995 | Hsue | 257/413 |
| 5,792,703 | 8/1998 | Bronner et la. | 438/620 |
| 5,956,594 | 9/1999 | Yang e tal. | 438/396 |

*Primary Examiner*—Charles Bowers
*Assistant Examiner*—Jack Chen
*Attorney, Agent, or Firm*—Thomas, Kayden, Horstemeyer & Rilsey

[57] ABSTRACT

A dynamic random access memory's (DRAM's) electrostatic discharge (ESD) protection circuit structure and its method of manufacture, wherein the ESD protection circuit and the capacitors are formed at the same time. The ESD protection circuit has a heavily doped drain structure so that hot carriers can be recruited for discharging electrostatics and a better electrostatic discharge protection can be achieved. Furthermore, no additional electrostatic discharge implant operations are necessary.

11 Claims, 10 Drawing Sheets

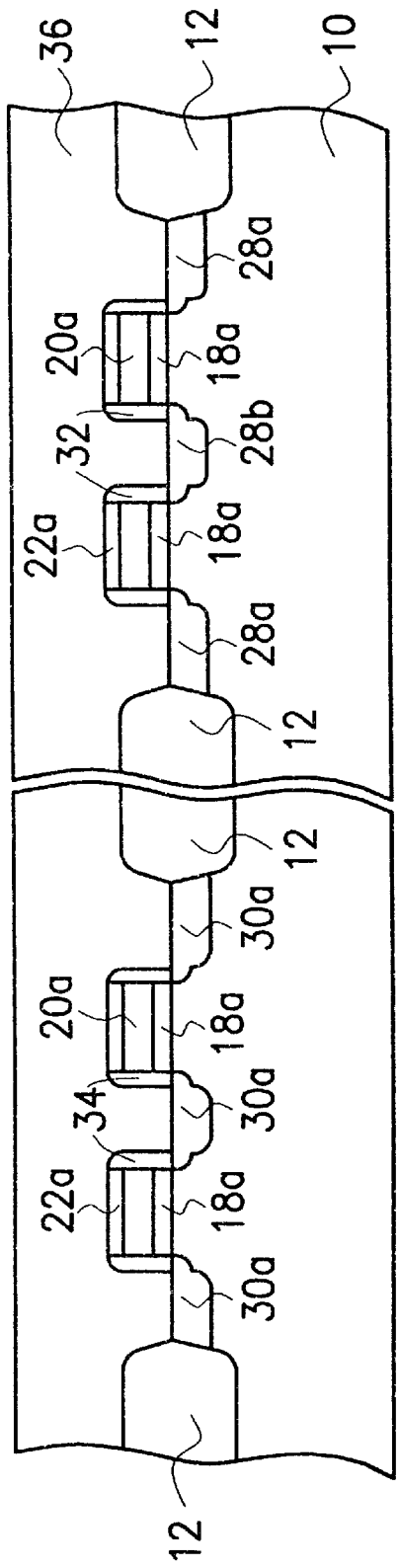
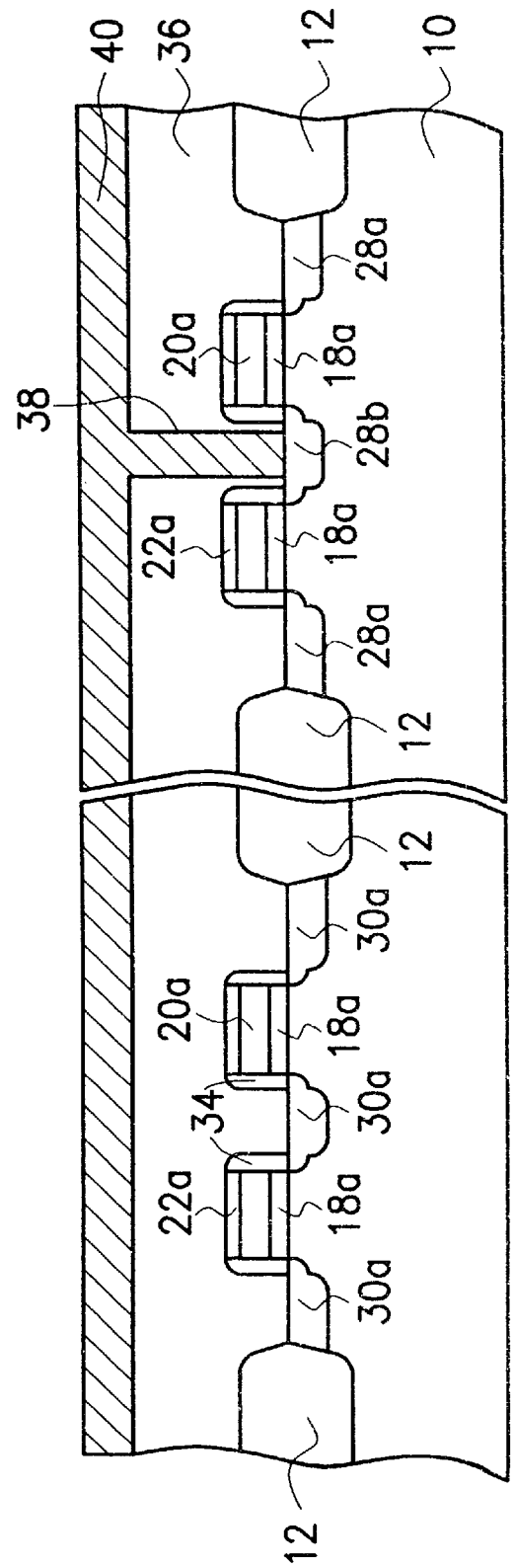
FIG. 1C (PRIOR ART)
FIG. 1D (PRIOR ART)

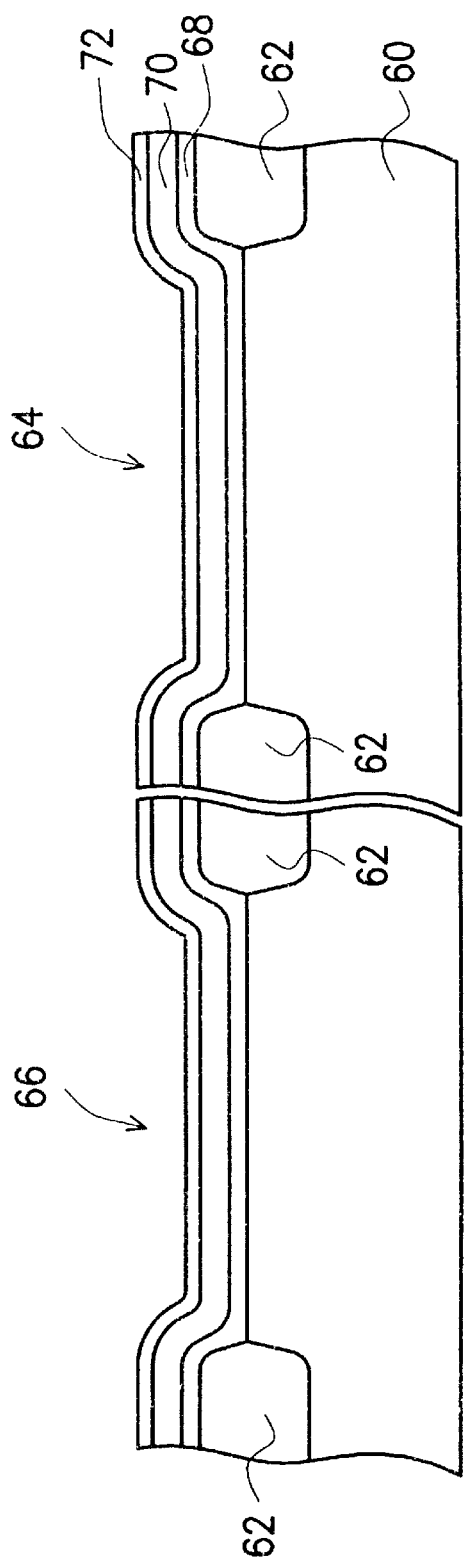
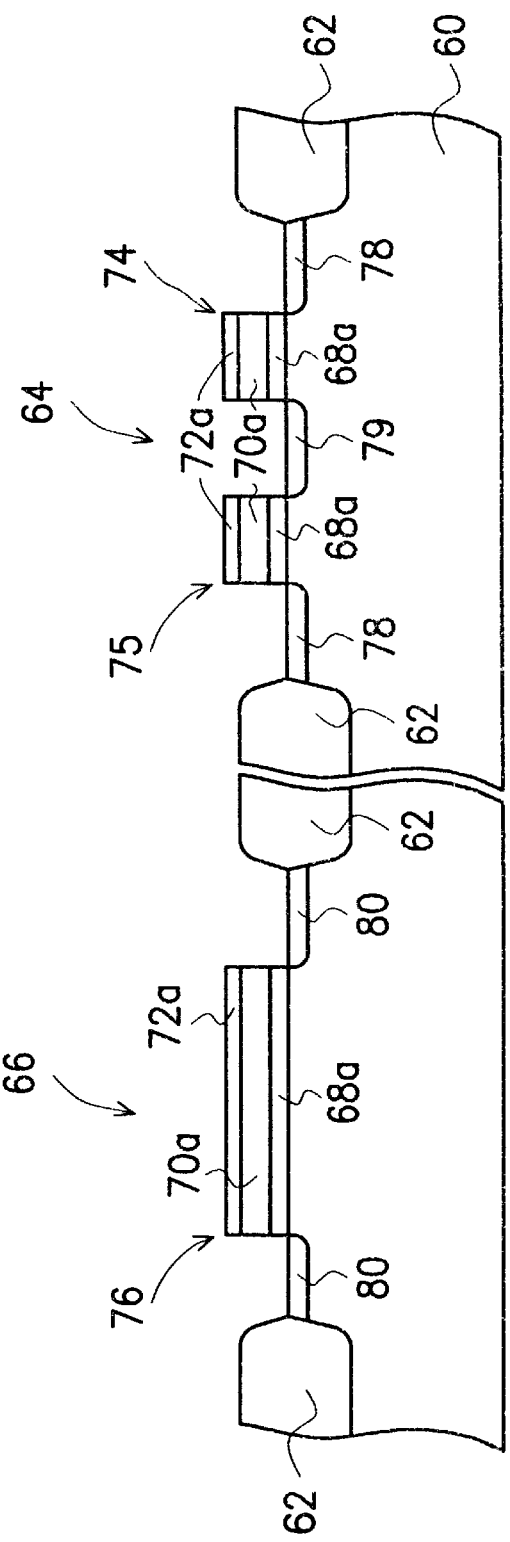
FIG. 2A
FIG. 2B

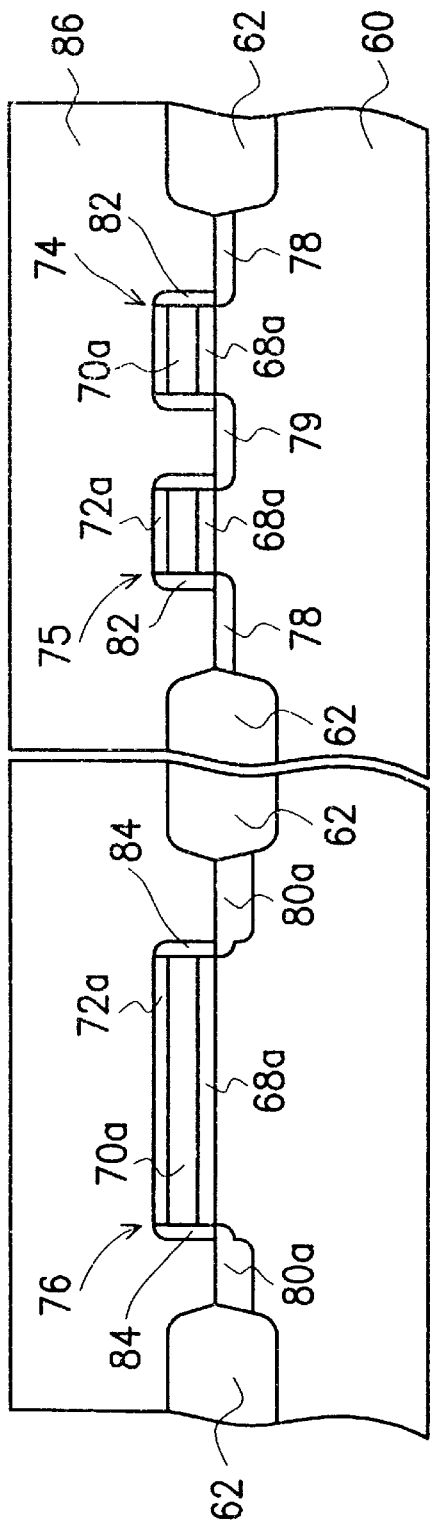
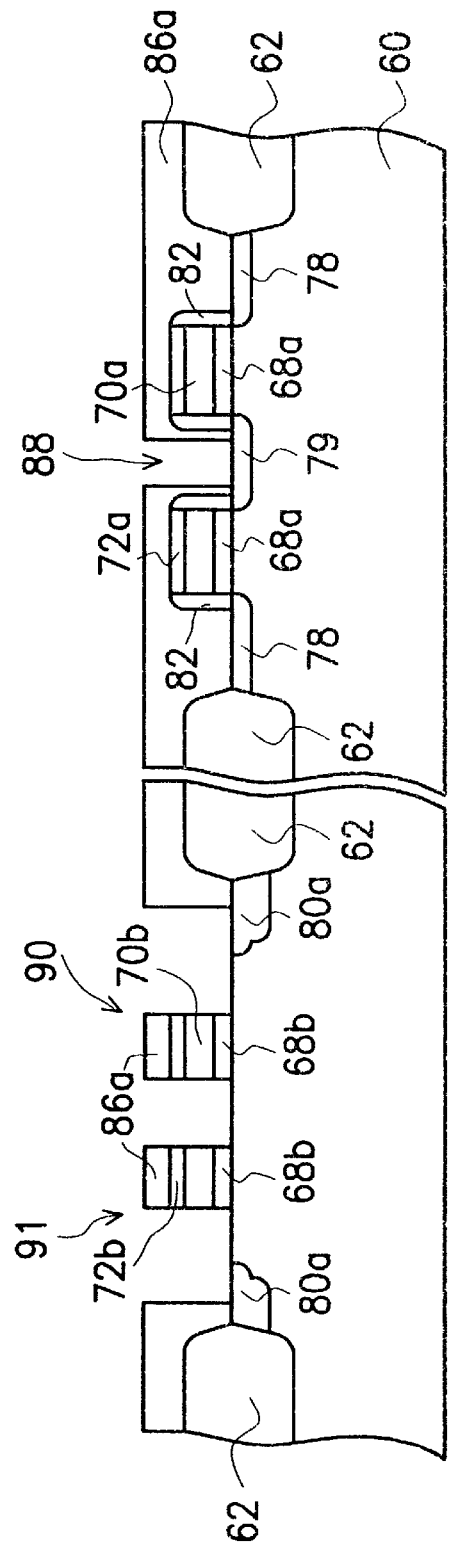
FIG. 2C
FIG. 2D

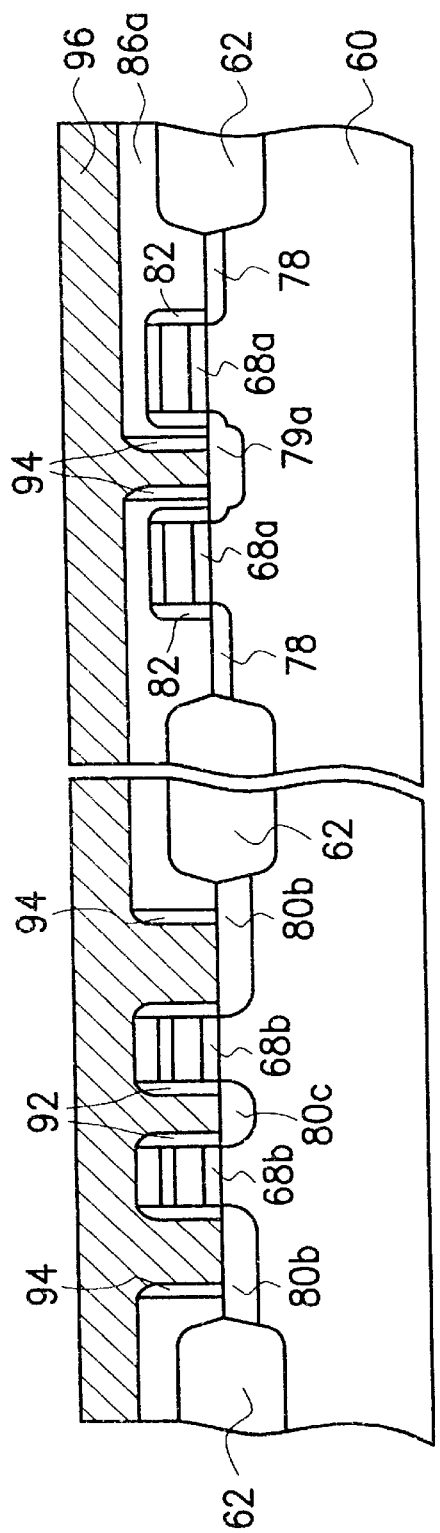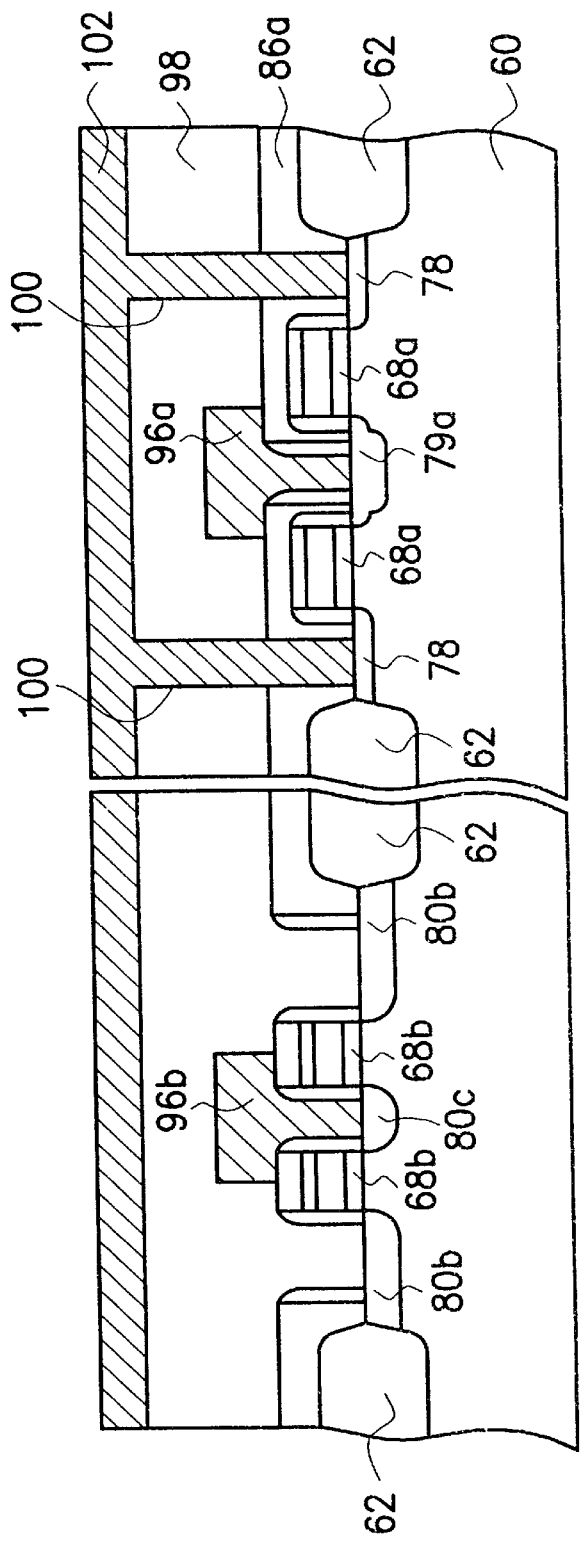

METHOD OF FORMING ELECTROSTATIC DISCHARGE PROTECTION STRUCTURE OF DYNAMIC RANDOM ACCESS MEMORY

CROSS-REFERENCE TO RELATED APPLICATION

This application claims the priority benefit of Taiwan application serial no. 87108986, filed Jun. 6, 1998, the full disclosure of which is incorporated herein by reference.

BACKGROUND OF THE INVENTION

1. Field of Invention

The present invention relates to a method of fabricating dynamic random access memory. More particularly, the present invention relates to an electrostatic discharge protection circuit structure of a dynamic random access memory and its method of manufacture.

2. Description of Related Art

Dynamic random access memory (DRAM) is a type of memory whose data are stored in an array of capacitors above a semiconductor substrate. The kind of data stored depends on the charging state of a capacitor. In general, a single bit of data is stored in a capacitor. A fully discharged capacitor represents a logic state of "0" while a fully charged capacitor represents a logic state of "1". If the electrodes of a capacitor in a DRAM are assembled correctly and the dielectric layer is uniformly built, the area of the electrode determines the amount of charges stored in a capacitor when the specified operating voltage is applied.

Read/write operation of a capacitor is achieved by selectively coupling the capacitor to a bit line so that electric charges can flow to the capacitor. Selective coupling of the capacitor is obtained through a transfer field effect transistor (transfer FET). Normally, the bit line is connected to one of the source/drain terminals of the transfer FET, and the other source/drain terminal of the transfer FET is connected to the capacitor. A word line is connected to the gate terminal of the transfer FET. By applying proper signal to the word line, flow of electric charges between the bit line and the capacitor can be controlled.

In general, in the fabrication of a capacitor over bit-line (COB) DRAM structure, an electrostatic discharge (ESD) protection circuit is also formed to protect the DRAM against any accidental damage due to external electrostatic discharge.

FIGS. 1A through 1G are cross-sectional views showing the progression of manufacturing steps in fabricating the electrostatic discharge protection circuit and capacitor of a DRAM according to a conventional method.

First, a semiconductor substrate 10 is provided as shown in FIG. 1A, and then an isolating structure 12 is formed over the substrate 10 defining a device region 14 and an ESD protective circuit region 16. The isolating structure 12 can be a shallow trench isolating structure or a field oxide layer, for example. Thereafter, a gate oxide layer 18, a polysilicon layer 20 and an oxide layer 22 are formed sequentially over the substrate structure.

Next, the oxide layer 22, the polysilicon layer 20 and the gate oxide layer 18 are patterned in sequence as shown in FIG. 1B. Ultimately, gate structures 24 and 26 are respectively formed in the device region 14 and the ESD protective circuit region 16. The gate structures 24 and 26 are both composite layers composed of a gate oxide layer 18a, a polysilicon layer 20a and an oxide layer 22a. In the subsequent step, an ion implant operation is carried out to implant ions into the semiconductor substrate 10 on the sides of the gate structures 24 and 26 to form lightly doped drain (LDD) source/drain regions 28 and 30.

Next, as shown in FIG. 1C, a layer of silicon nitride material having a thickness of about 1000 Å is deposited over the substrate structure using, for example, a plasma-enhanced chemical vapor deposition (PECVD) method. Subsequently, the silicon nitride layer is etched back to form spacers 32 and 34 on the sidewalls of the gate structures 24 and 26 using, for example, an anisotropic etching method. Thereafter, a second ion implantation is carried out to implant ions into the substrate to form heavily doped source/drain regions 28a, 28b and 30a. Later, a dielectric layer 36 is formed covering the entire substrate structure using, for example, a low-pressure chemical vapor deposition (LPCVD) method. The dielectric layer 36 can be made from tetra-ethyl-ortho-silicate (TEOS), for example.

Next, as shown in FIG. 1D, the dielectric layer 36 is patterned by first forming a photoresist layer. Then, a contact opening 38 that expose the source/drain region 28b (for example, a source region) is formed in the device region 14 using, for example, a dry etching method. The contact opening 38 is subsequently used to form a bit line. Thereafter, the photoresist layer is removed, and a doped polysilicon layer 40 having a thickness of about 1000 Å is formed over the substrate structure using, for example, a low-pressure chemical vapor deposition method. The doped polysilicon layer 40 also completely fills the contact opening 38 to make an electrical contact with the exposed source/drain region 28b.

Next, the polysilicon layer 40 is patterned to form a polysilicon layer 40a using conventional photolithographic and etching processes as shown in FIG. 1E. The polysilicon layer 40a serves as a bit line for the DRAM. Thereafter, a dielectric layer 42 having a thickness of about 7000 Å is formed over the dielectric layer 36 and the polysilicon layer 40a using, for example, a plasma-enhanced chemical vapor deposition method. The dielectric layer 42 can be made from material including phosphosilicate glass (PSG). Subsequently, the dielectric layer 42 and the dielectric layer 36 in the device area 14 are sequentially etched to form contact openings 44 of the capacitor using, for example, a dry etching method. The contact openings expose the source/drain regions 28a. Then, a polysilicon layer 46 is formed over the entire substrate structure. The polysilicon layer 46 also fills the contact openings 44 so that the exposed source/drain regions 28a are electrically connected.

Next, as shown in FIG. 1F, conventional photolithographic and etching techniques are used to pattern the polysilicon layer 46 forming a polysilicon layer 46a. The polysilicon layer 46a functions as the lower electrode of a DRAM capacitor. Thereafter, a dielectric layer 48 and another polysilicon layer 50 are sequentially formed over the lower electrode. The dielectric layer 48, for example, can be an oxide/nitride/oxide (ONO) composite layer, and the polysilicon layer 50 functions as the upper electrode of the DRAM capacitor. Subsequently, a borophosphosilicate glass (BPSG) layer 52 is formed over the entire substrate structure using, for example, a plasma-enhanced chemical vapor deposition method. After that, the BPSG layer 52, the dielectric layer 42 and the dielectric layer 36 in the ESD protection circuit region 16 are sequentially patterned to form contact openings 54 and 56 using, for example, a dry etching method. The contact opening 54 exposes the gate structures 26, while the contact opening 56 exposes the source/drain regions 30a.

Next, as shown in FIG. 1G, conductive material such as tungsten is deposited over the substrate structure to form a conductive layer 58 using a chemical vapor deposition method, for example. The conductive layer 58 also fills the contact openings 54 and 56 so that the exposed gate structures 26 and the exposed source/drain regions 30a are electrically connected. Subsequently, the conductive layer 58 is patterned to form the DRAM's ESD protection circuit as shown in FIG. 1G.

Finally, subsequent operations necessary for forming the DRAM structure is performed. Since those manufacturing operations are familiar to semiconductor technologists and have no direct relation to this invention, detailed description is omitted here.

In the aforementioned method of production, the ESD protective circuit and the capacitors are completed at the same time without additional operations. However, the conventional DRAM's ESD protective circuit has a lightly doped drain (LDD) structure. Therefore, the degree of utilization of hot carrier in electrostatic discharge is low, and hence the extent of electrostatic discharge protection is poor. Consequently, DRAM may be insufficiently protected and damages caused by electrostatic discharge may be common.

In light of the foregoing, there is a need to provide an improved ESD protective circuit structure for DRAM together with the method of fabricating the structure.

SUMMARY OF THE INVENTION

Accordingly, the present invention is to provide an electrostatic discharge (ESD) protection circuit for dynamic random access memory (DRAM) having a heavily doped drain structure capable of providing a better electrostatic discharge protection and preventing any damage to the DRAM.

In another aspect, this invention provides a method of forming an ESD protection circuit in DRAM such that the ESD protection circuit and capacitors are formed through the same set of operations. There is no need for performing additional steps or any additional electrostatic discharge implant operation. Hence, cost of production can be saved.

To achieve these and other advantages and in accordance with the purpose of the invention, as embodied and broadly described herein, the invention provides a method of forming an ESD protection circuit for DRAM such that the ESD protection circuit and the capacitors are formed at the same time. Furthermore, the ESD protection circuit has a heavily doped drain structure so that hot carriers can be recruited for discharging electrostatics without having to provide an additional electrostatic discharge implant operation. Consequently, a better electrostatic discharge protection can be achieved with a lower cost of production.

It is to be understood that both the foregoing general description and the following detailed description are exemplary, and are intended to provide further explanation of the invention as claimed.

BRIEF DESCRIPTION OF THE DRAWINGS

The accompanying drawings are comprised to provide a further understanding of the invention, and are incorporated in and constitute a part of this specification. The drawings illustrate embodiments of the invention and, together with the description, serve to explain the principles of the invention. In the drawings, FIGS. 1A through 1G are cross-sectional views showing the progression of manufacturing steps in fabricating the electrostatic discharge protection circuit and capacitor of DRAM according to a conventional method; and FIGS. 2A through 2H are cross-sectional views showing the progression of manufacturing steps in fabricating the electrostatic discharge protection circuit and capacitor of DRAM according to one preferred embodiment of this invention.

DESCRIPTION OF THE PREFERRED EMBODIMENTS

Figure 1A:
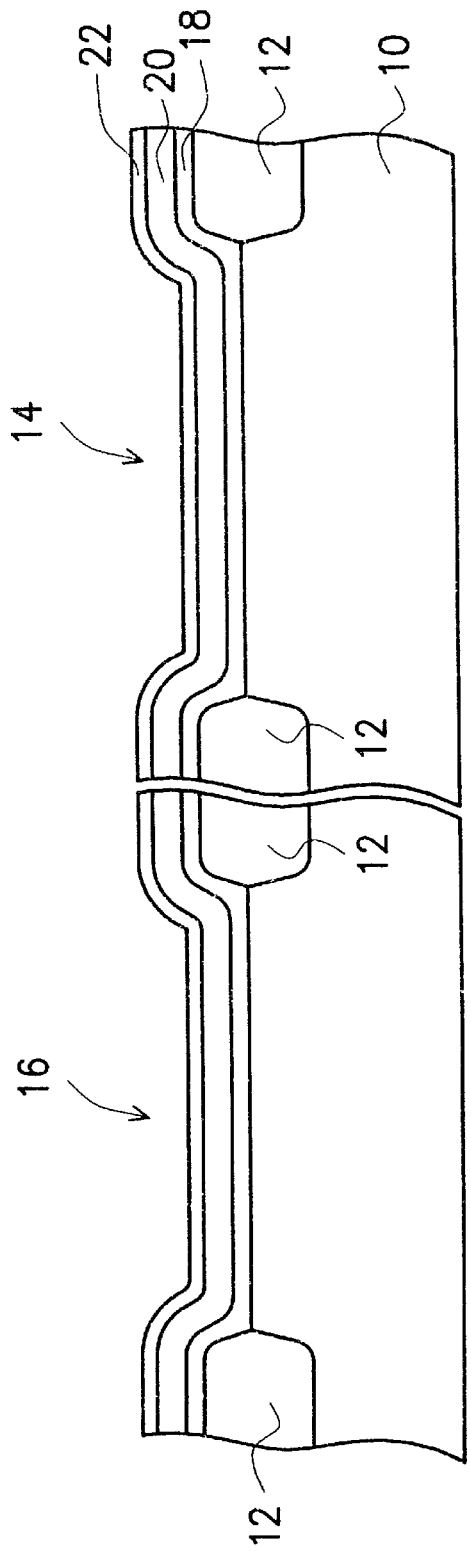
Figure 1B:
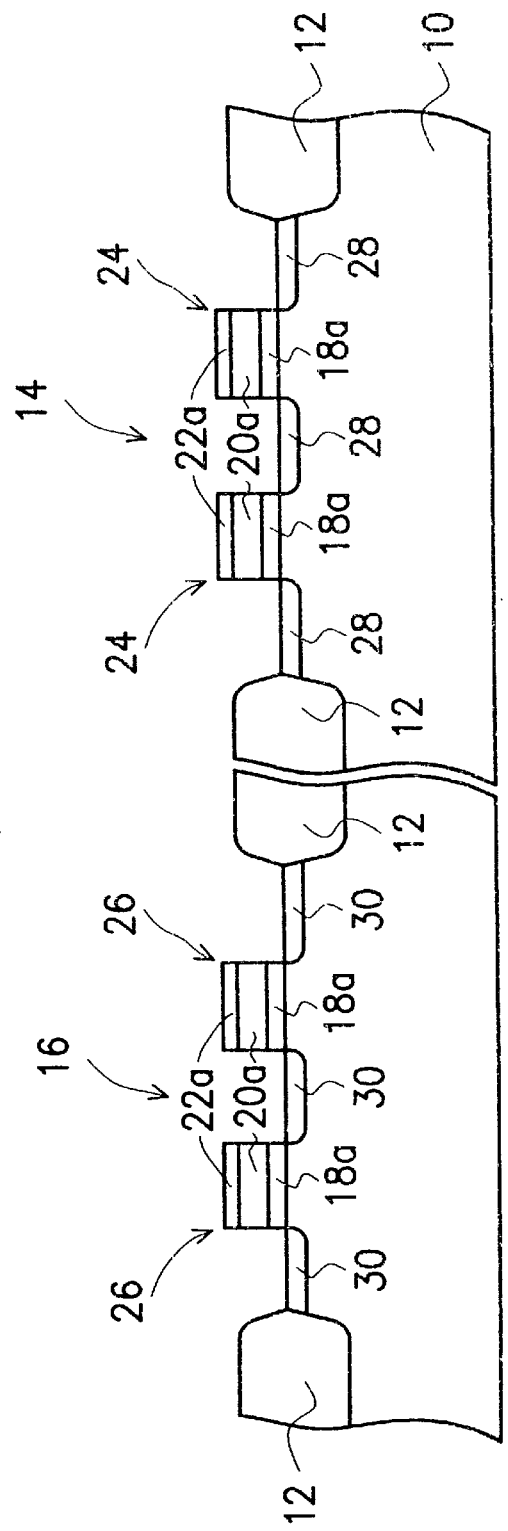
Figure 1E:
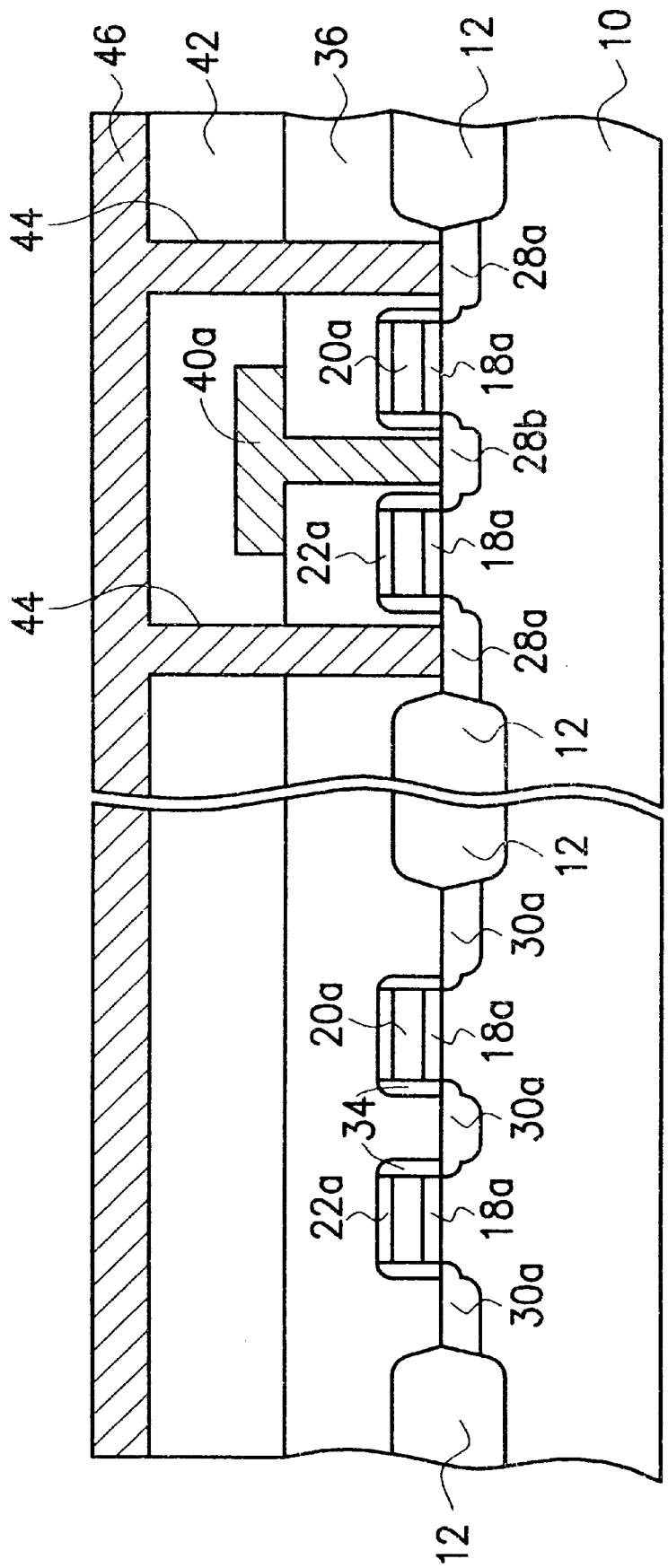
Figure 1F:
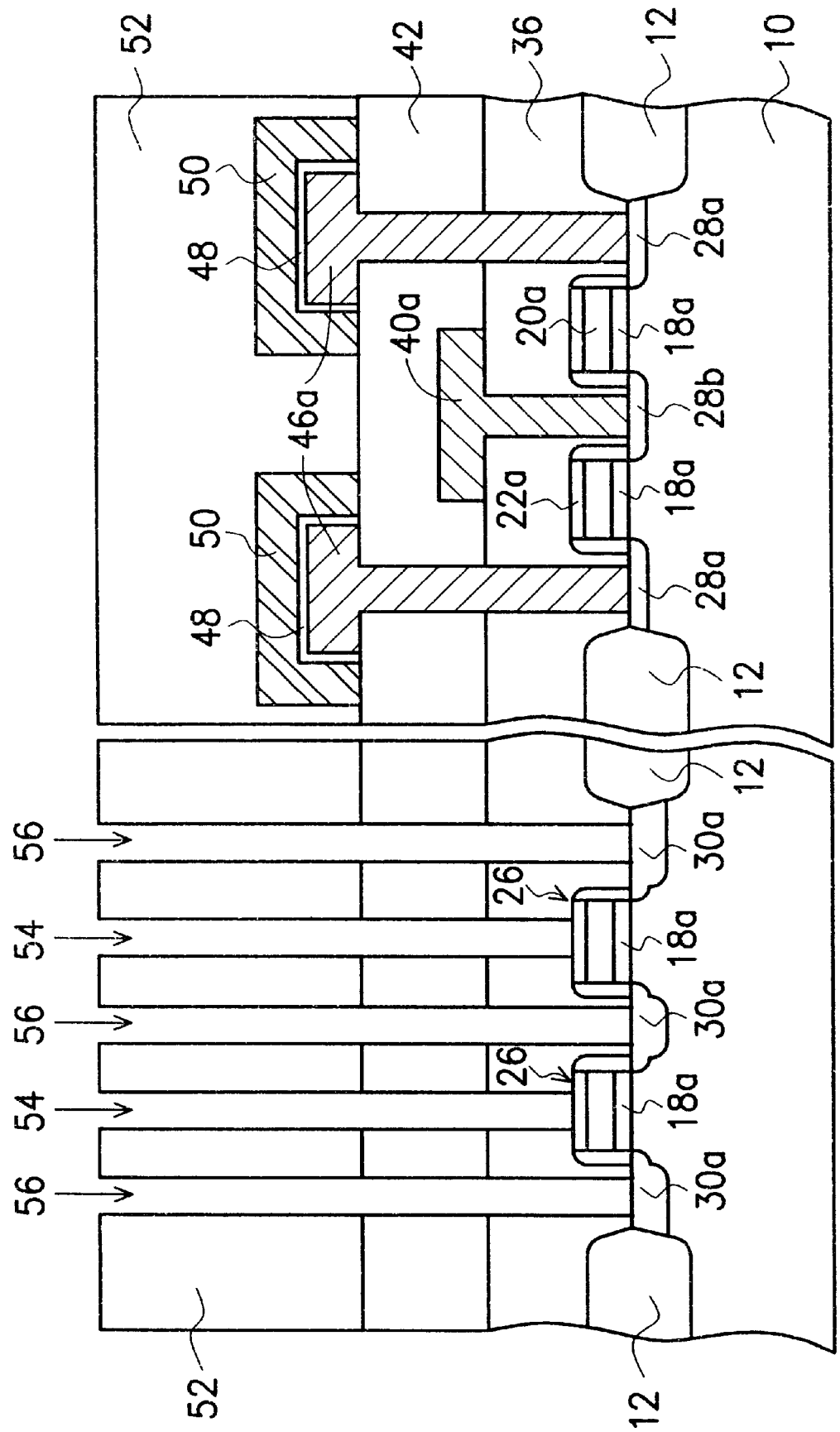
Figure 1G:
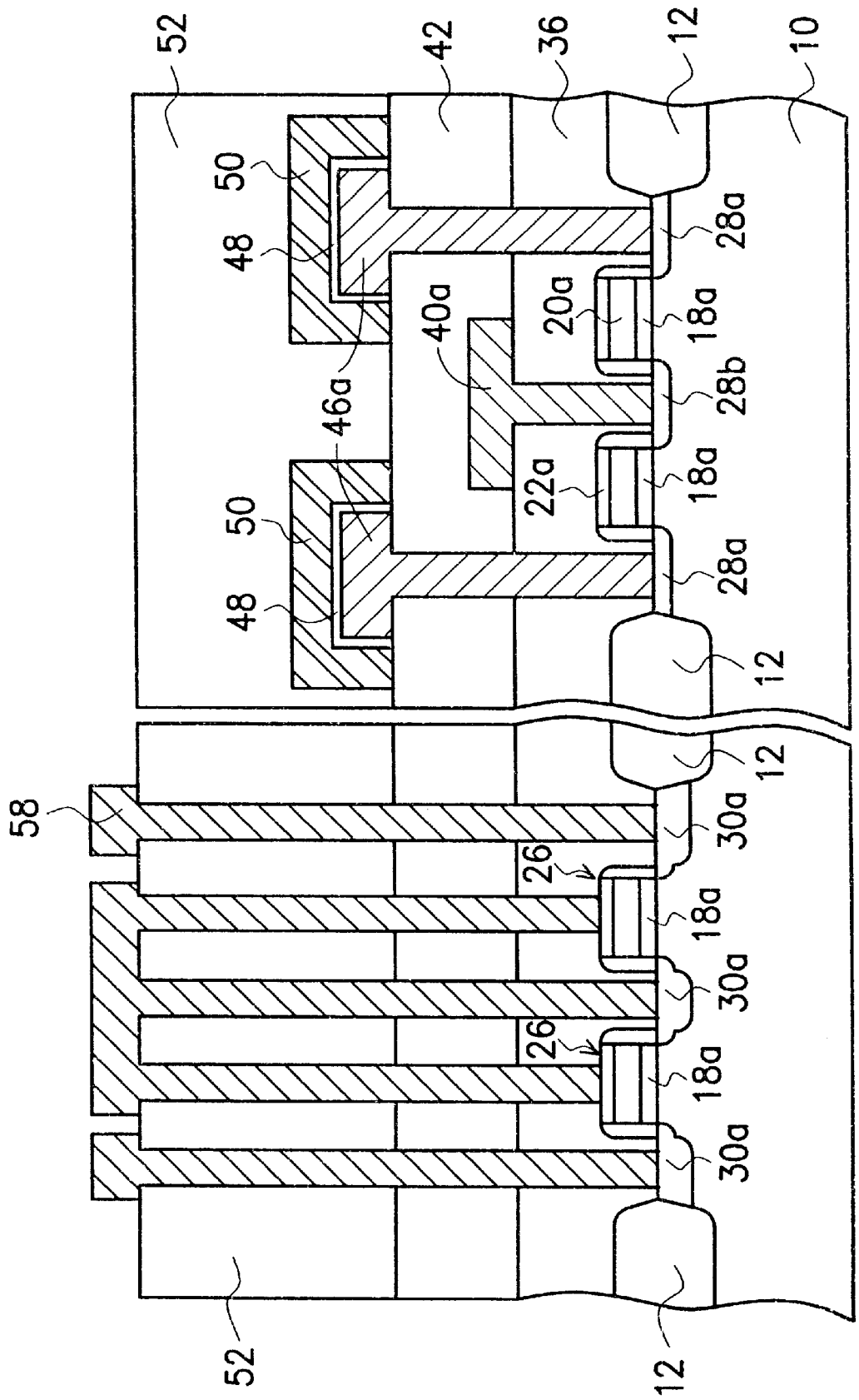

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2H are cross-sectional views showing the progression of manufacturing steps in fabricating the electrostatic discharge protection circuit and capacitor of DRAM according to one preferred embodiment of this invention.

First, a semiconductor substrate 60 is provided as shown in FIG. 2A, and then an isolating structure 62 is formed over the substrate 60 to define a device region 64 and an ESD protective circuit region 66. The isolating structure 62 can be a shallow trench isolating structure or a field oxide layer, for example. Thereafter, a gate oxide layer 68, a polysilicon layer 70 and an oxide layer 72 are formed sequentially over the substrate structure.

Next, the oxide layer 72, the polysilicon layer 70 and the gate oxide layer 68 are patterned in sequence as shown in FIG. 2B. Ultimately, gate structures 74, 75 and 76 are formed in the device region 64 and the ESD protective circuit region 66, respectively. The gate structures 74, 75 and 76 are composite layers composed of a gate oxide layer 68a, a polysilicon layer 70a and an oxide layer 72a. In addition, the gate structure 76 in the ESD protective circuit region 66 is patterned to have a larger surface area as shown in FIG. 2B.

In the subsequent step, an ion implantation is carried out implanting ions into the semiconductor substrate 60 on the sides of the gate structures 74, 75 and 76 to form lightly doped drain (LDD) source/drain regions 78, 79 and 80. The source/drain region 79 becomes a common source/drain region of the gate structures 74 and 75.

Next, as shown in FIG. 2C, a layer of silicon nitride material having a thickness of about 1000 Å is deposited over the substrate structure using, for example, a plasma-enhanced chemical vapor deposition (PECVD) method. Subsequently, the silicon nitride layer is etched back to form spacers 82 and 84 on the sidewalls of the gate structures 74, 75 and 76 using, for example, an anisotropic etching method. Thereafter, a second ion implantation is carried out implanting ions into the substrate to form heavily doped source/drain regions 80a in the ESD protective circuit region 66. Later, a dielectric layer 86 is formed covering the substrate structure using, for example, a low-pressure chemical vapor deposition (LPCVD) method. The dielectric layer 86 can be made from tetra-ethyl-ortho-silicate (TEOS), for example.

Next, as shown in FIG. 2D, the dielectric layer 86 is patterned. First, a photoresist layer is formed over the substrate. Then, a contact opening 88 that exposes the source/drain region 79 (for example, a source region) is formed in the device region 64 using, for example, a dry etching method. The contact opening 88 is subsequently used to form a bit line. Gate structures 90, 91 are also formed in the ESD protective circuit region 66 as shown in FIG. 2D. The gate structures 90, 91 are composite layers composed of an oxide layer 68b, a polysilicon layer 70b, an oxide layer 72b and a dielectric layer 86a. Finally, the photoresist layer is removed.

Next, as shown in FIG. 2E, a third ion implantation operation is carried out to implant ions into the substrate 60 on each side of the gate structures 90, 91 and the exposed substrate 60. Hence, heavily doped source/drain regions 79a, 80b and 80c are formed, wherein the source/drain region 80c forms a common source/drain region for the gate structures 90, 91. Thereafter, a layer of silicon nitride having a thickness of about 1000 Å is formed over the substrate structure using, for example, a plasma-enhanced chemical vapor deposition method.

Subsequently, the silicon nitride layer is etched back using an anisotropic etching method, for example, to form spacers 92 and 94 on the sidewalls of the gate structures 90, 91 and the dielectric layer 86a, respectively. Then, a doped polysilicon layer 96 having a thickness of about 1500 Å is formed over the substrate structure using, for example, a low-pressure chemical vapor deposition method. The doped polysilicon layer also fills the contact opening 88 to form an electrical connection with the exposed source/drain region 79a.

Next, conventional photolithographic and etching techniques are used to pattern the polysilicon layer 96 to form polysilicon layers 96a and 96b as shown in FIG. 2F. The polysilicon layer 96a is used as a bit line in a capacitor. On the other hand, the polysilicon layer 96b is connected to the gate structures 90, 91 and the source/drain region 80c, and the polysilicon layer 96 is used as a resistor for the ESD protective circuit. Thereafter, a dielectric layer 98 having a thickness of about 7000 Å is formed over the substrate structure, wherein the dielectric layer 98 can be made from phosphosilicate glass (PSG).

Subsequently, the dielectric layer 98 and then the dielectric layer 86a in the device region 64 are patterned using a dry etching method, for example, to form capacitor's contact openings 100 that exposes the source/drain regions 78. Then, a polysilicon layer 102 is formed over the substrate structure filling the contact opening 100. Thus, the exposed source/drain regions 78 are electrically connected.

Figure 2G:
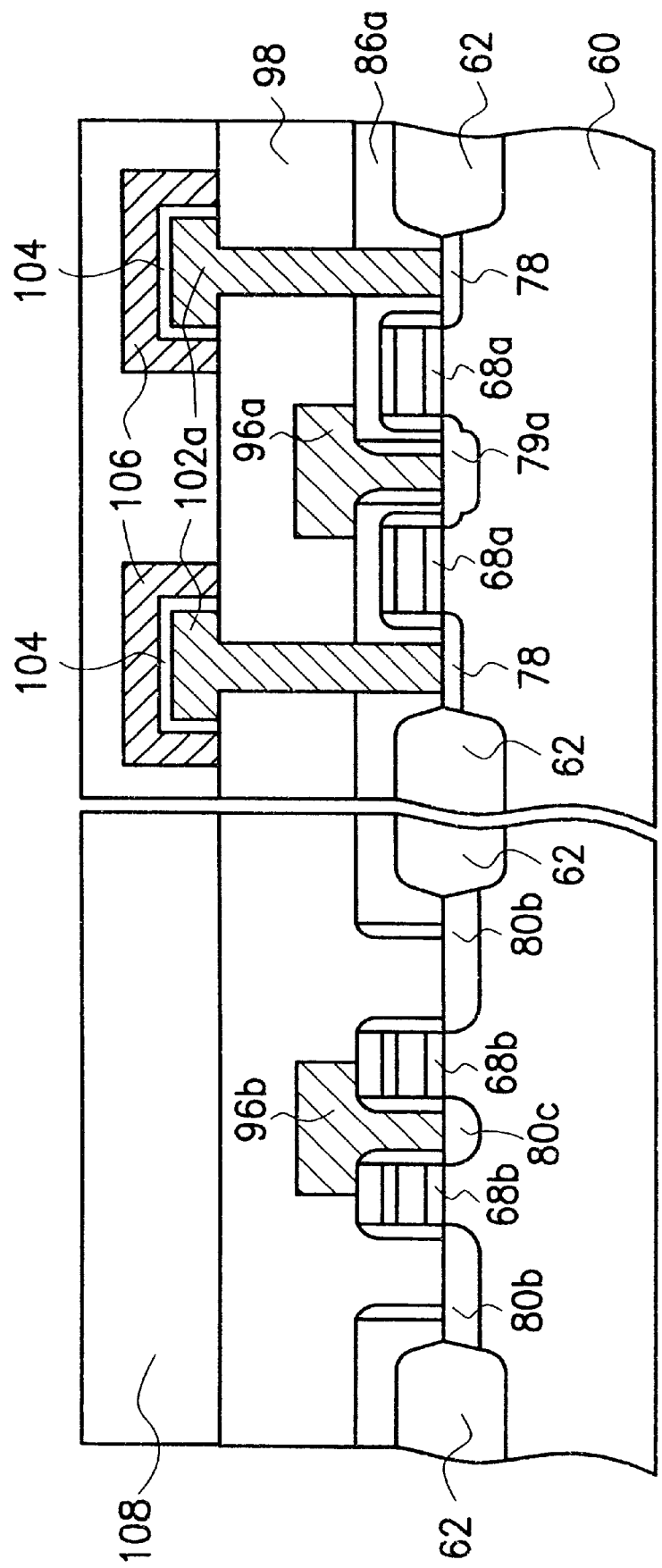

Next, as shown in FIG. 2G, conventional photolithographic and etching techniques are used to pattern the polysilicon layer 102 to form polysilicon layers 102a. The polysilicon layers 102a are used as lower electrodes of the capacitors. In the subsequent step, a dielectric layer 104 and a polysilicon layer 106 are sequentially formed over the lower electrode and then the dielectric layer 104 and the polysilicon layer 106 are patterned. The dielectric layer 104 can be a composite layer, for example, an oxide/nitride/oxide layer. The polysilicon layer 106 serves as an upper electrode of the capacitor. Hence, the capacitor structures of DRAM are complete. Thereafter, a borophosphosilicate glass (BPSG) layer 108 is deposited over the substrate using, for example, a plasma-enhanced chemical vapor deposition method.

Figure 2H:
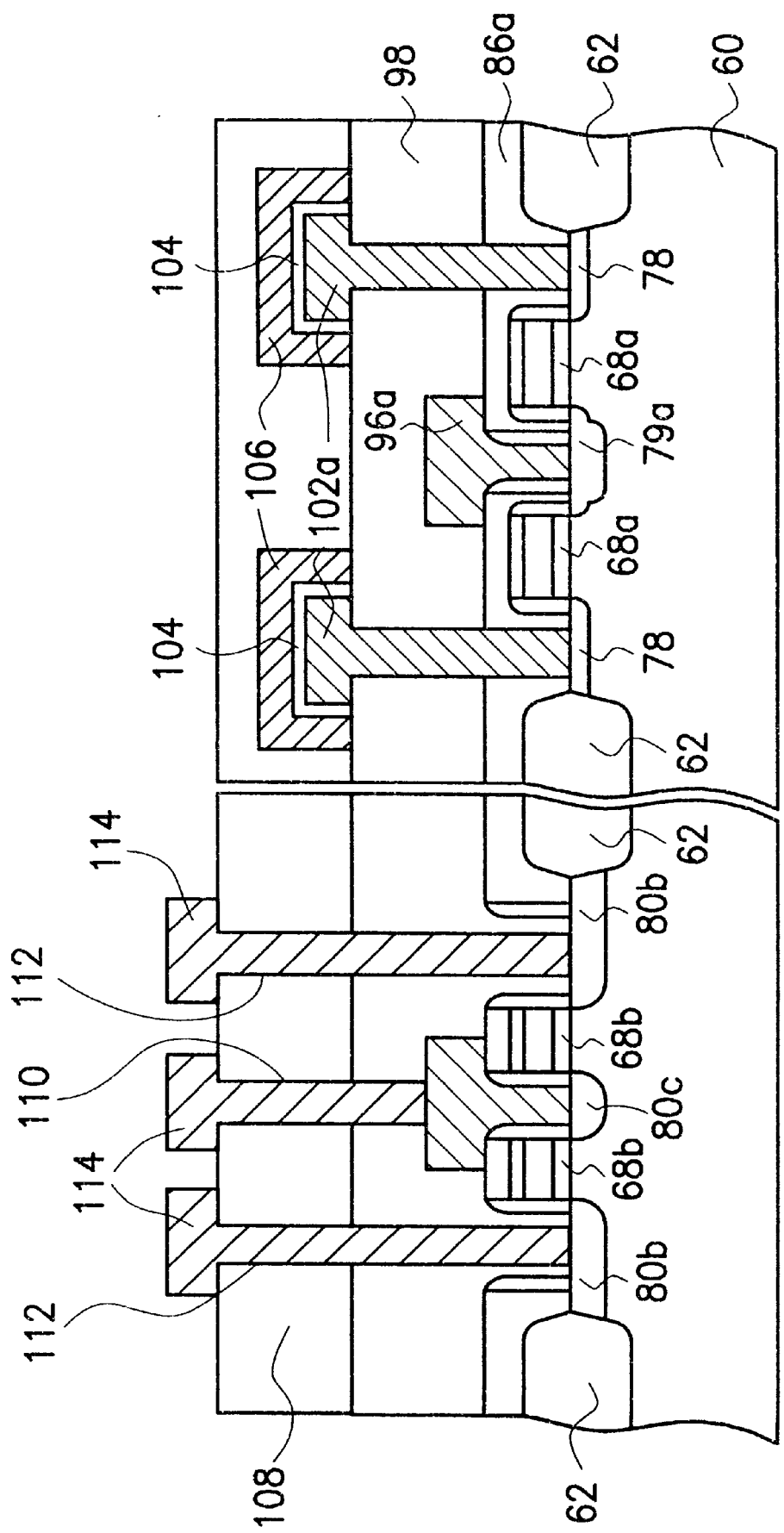

Next, as shown in FIG. 2H, the BPSG layer 108 and the dielectric layer 98 in the ESD protective circuit region 66 are patterned using, for example, a dry etching method. Consequently, contact openings 110 that expose the polysilicon layer 96b and the contact opening 112 that expose the source/drain regions 80b are formed. Thereafter, a chemical vapor deposition method is used to form a conductive layer 114, for example, a tungsten layer that fills the contact openings 110 and 112 and covers the substrate. Hence, the polysilicon layer 96b and the source/drain regions 80b exposed by the respective openings 110 and 112 are electrically connected. Finally, the conductive layer 114 is patterned to form the ESD protective circuit structure as shown in FIG. 2H.

Finally, subsequent operations necessary for forming the DRAM structure are performed. Since those manufacturing operations are familiar to semiconductor technologists and have no direct relation with this invention, detailed description is omitted here.

From the aforementioned description of the method of forming ESD protection circuit in DRAM, the ESD protection circuit and capacitors are completed at the same time and by using the same set of operations. There is no need to perform additional operations.

In summary, one major aspect of this invention is that the ESD protection circuit has a heavily doped drain structure. Therefore, hot carriers are recruited for discharging external charges generated by electrostatics. Hence, a better electrostatic discharge protection than the lightly doped drain structure of a conventional ESD protection circuit can be obtained, and possible damages to the DRAM can be prevented.

Another aspect of this invention is that there is no need to carry out another electrostatic discharge implant of the source/drain region. Consequently, production cost can be lowered.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming electrostatic discharge protection circuit of dynamic random access memory, the method comprising the steps of:

providing a semiconductor substrate, wherein the semiconductor substrate having an isolating structure that separates the substrate into a device region and a protective circuit region, and a first gate structure and a second gate structure are formed in the device region and the protective circuit region, respectively;

performing a first ion implantation by implanting ions into the substrate on each side of the first gate structure and the second gate structure to form a lightly doped first source/drain region and a first common source/drain region in the device region and a lightly doped first source/drain region in the protective circuit region;

forming first spacers and second spacers over sidewalls of the first gate structure and the second gate structure, respectively;

performing a lightly doped first ion implantation by implanting ions into the second source/drain region in the protective circuit region to form a heavily doped first source/drain region;

forming a first dielectric layer over an entire substrate;

patterning the first dielectric layer to form a first contact opening that exposes the first common source/drain region in the device region, and forming a third gate structure in the protective circuit region;

performing a third ion implantation by implanting ions into the first common source/drain region exposed by the first contact opening and the semiconductor substrate on each side of the third gate structure, thereby forming a heavily doped first common source/drain region in the device region, and a heavily doped second source/drain region and a heavily doped first common source/drain region in the protective circuit region;

forming third spacers covering sidewalls of the third gate structure and the first dielectric layer;

forming a bit line and a resistor that connect to the first common source/drain region exposed by the first contact opening and the heavily doped first common source/drain region, respectively;

forming a second dielectric layer over the entire substrate;

patterning the second dielectric layer and the first dielectric layer in the device region to form a second contact opening that exposes the lightly doped first source/drain region;

forming a lower electrode to connect to the lightly doped first source/drain region exposed through the second contact opening;

forming a third dielectric layer and an upper electrode over the lower electrode to complete a capacitor in dynamic random access memory;

forming a fourth dielectric layer over the entire substrate;

patterning the fourth dielectric layer and the second dielectric layer in the protective circuit region to form a third contact opening and a fourth contact opening that expose the resistor and the heavily doped second source/drain region, respectively; and forming a conductive layer over the entire substrate to connect to the resistor and the heavily doped second source/drain region.

2. The method of claim 1, wherein the isolating structure comprises a field oxide layer.

3. The method of claim 1, wherein the steps of forming the first and second spacers comprises a plasma-enhanced chemical vapor deposition method.

4. The method of claim 1, wherein the steps of forming the first and second spacers comprises depositing silicon nitride material.

5. The method of claim 1, wherein the step of forming the bit line and the resistor comprises a low-pressure chemical vapor deposition method.

6. The method of claim 1, wherein the step of forming the first dielectric layer comprises depositing tetra-ethyl-orthosilicate.

7. The method of claim 1, wherein the step of forming the first dielectric layer comprises depositing borophosphosilicate glass.

8. The method of claim 1, wherein the step of forming the first dielectric layer comprises a low-pressure chemical vapor depositing method.

9. The method of claim 1, wherein the step of patterning the first dielectric layer comprises a dry etching method.

10. The method of claim 1, wherein the step of forming the conductive layer comprises depositing tungsten material.

11. The method of claim 1, wherein the step of forming the conductive layer comprises a chemical vapor deposition method.

* * * * *